United States Patent [19]

Zimmerman

[11] Patent Number: 4,757,508
[45] Date of Patent: Jul. 12, 1988

[54] TRACKING MODULATION LIMITER FOR LASERS

[75] Inventor: David E. Zimmerman, Grass Valley, Calif.

[73] Assignee: The Grass Valley Group, Inc., Grass Valley, Calif.

[21] Appl. No.: 129,617

[22] Filed: Dec. 7, 1987

[51] Int. Cl.[4] ............................................... H01S 3/10
[52] U.S. Cl. ...................................... 372/26; 372/38; 372/46; 372/33
[58] Field of Search ........................ 372/26, 38, 46, 33, 372/29–32

[56] References Cited

U.S. PATENT DOCUMENTS

| | | | |
|---|---|---|---|
| 4,243,951 | 1/1981 | Wolkstein et al. | 372/26 |
| 4,399,418 | 8/1983 | Forrester | 372/26 |
| 4,611,325 | 9/1986 | Fujito et al. | 372/26 |
| 4,625,315 | 11/1986 | Lemberger et al. | 372/26 |

Primary Examiner—Leon Scott, Jr.
Attorney, Agent, or Firm—Francis I. Gray

[57] ABSTRACT

A tracking modulation limiter for laser diodes tracks from the output of a laser diode the maximum forward current. The maximum forward current is multiplied by a factor less than one to generate a control current representative of the maximum negative modulation for the laser diode. The control current is modulated by an input modulation signal and combined with the maximum forward current to drive the laser diode so that the drive current does not fall below threshold.

7 Claims, 2 Drawing Sheets

TRACKING MODULATION LIMITER FOR LASERS

BACKGROUND OF THE INVENTION

The present invention relates to amplitude modulated lasers, and more particularly to a tracking modulation limiter for lasers to provide control of the depth of modulation.

Semiconductor laser diodes have two distinct modes or areas of operation that are functions of the forward current flowing in them. The small current light emitting diode (LED) region is characterized by low differential (slope) efficiency of non-coherent radiant flux. The large current region is characterized by high efficiency of coherent radiant flux. The transition region where the semiconductor diode begins to "lase" is termed the threshold. When amplitude modulating a laser diode it is desirable to remain above threshold to maintain a detectable optical carrier, yet it is also desirable to allow modulation peaks to approach threshold to maintain as large a dynamic range as possible. Amplitude modulation can be either white positive or white negative modulation. In television transmission white negative modulation is often employed because the synchronizing information is then transmitted at maximum power. Further the laser diode transform characteristics change as a function of temperature and age which varies the threshold.

What is desired is a tracking modulation limiter for laser diodes which limits the negative modulation that can be applied to a laser diode to assure that the laser diode remains above threshold while maintaining as large a dynamic range as possible regardless of variations in the threshold due to temperature and age of the laser diode.

SUMMARY OF THE INVENTION

Accordingly the present invention provides a tracking modulation limiter for laser diodes by measuring in an automatic power control loop the maximum forward current applied during a sampled maximum positive modulation. The maximum forward current is multiplied by some number less than one, and the resultant control current represents the maximum negative modulation that may be applied to the laser diode. The control current is turned around in a current mirror and modulated by an input modulation signal. The modulated current is combined with the maximum forward current to drive the laser diode, and tracks the maximum forward current to prevent under or over modulation regardless of variations in laser diode transform characteristics The objects, advantages and other novel features of the present invention are apparent from the following detailed description when read in conjunction with the appended claims and attached drawing.

DESCRIPTION OF THE PREFERRED EMBODIMENT

Figure 1:
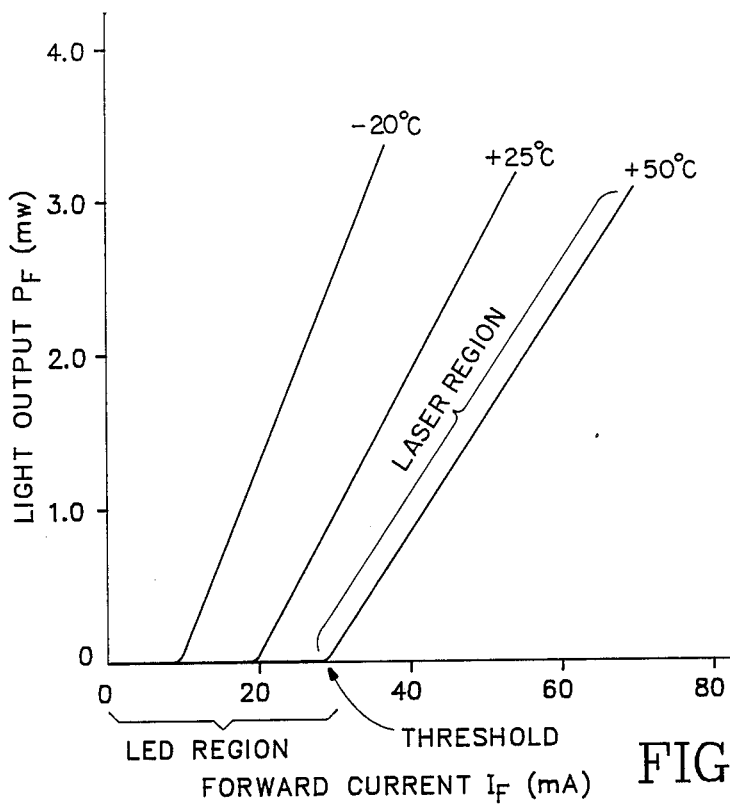
FIG. 1 is a graph of a typical laser diode characteristic.

Referring now to FIG. 1 a graph of a typical laser diode characteristic is shown as a function of forward current and temperature. As is apparent as the temperature of the laser diode increases, the amount of current required to achieve the same output power also increases. Therefore the threshold at which the laser diode transitions from the LED region to the lasing region also increases. For example to achieve a two milliwatt output at −20° C. requires a forward current of approximately 26 milliamps with a threshold of approximately 10 milliamps. However at +50° C. for the same power output a forward current of approximately 56 milliamps with a threshold of approximately 30 milliamps is required. To determine the maximum forward current of the laser diode it is necessary to sample the laser diode output at its peak power output, i.e., where the positive modulation is maximum. For a white negative video modulation signal the peak power output occurs during the horizontal sync interval.

Figure 2:
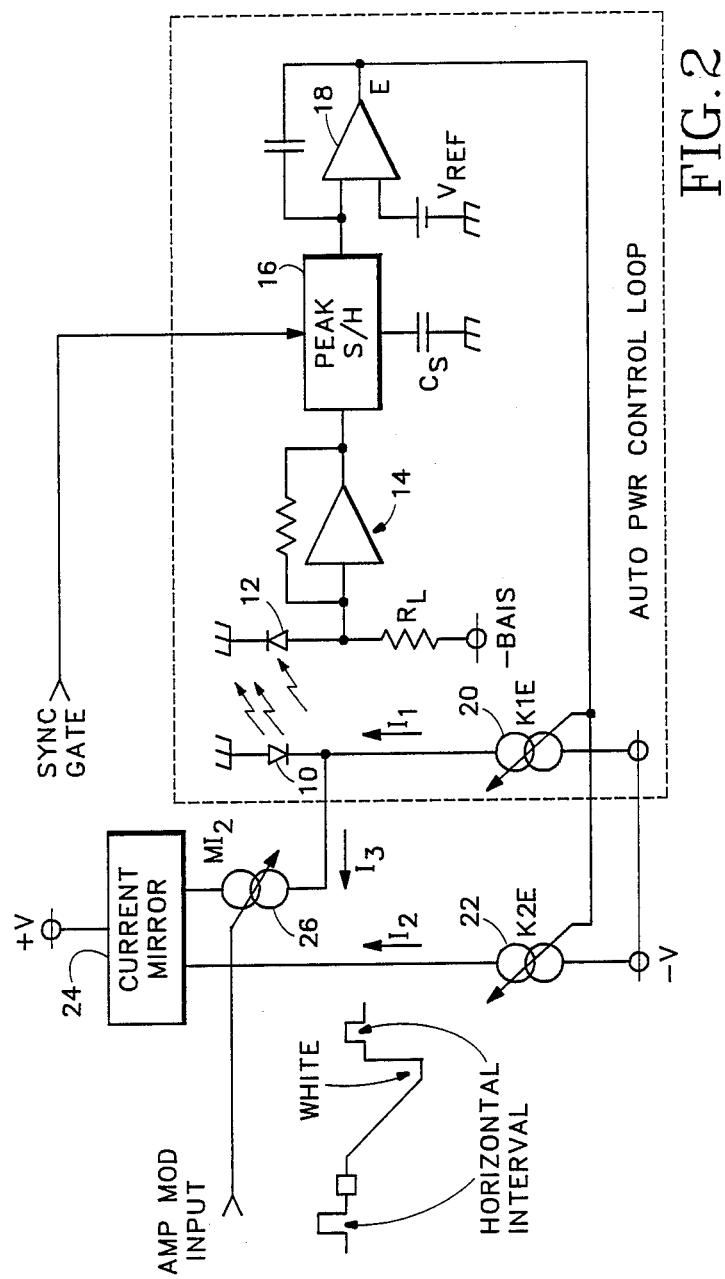
FIG. 2 is a block diagram of a tracking modulation limiter for a laser diode according to the present invention.

As shown in FIG. 2 the output of a laser diode 10 is detected by a photodiode 12 to produce a corresponding electrical current in a load resistor $R_L$. The voltage induced across the load resistor is input to an amplifying circuit 14, such as a transconductance amplifier, with the output being input to a subsequent sample/hold circuit 16 having a storage capacitor $C_s$. The sample/hold circuit 16 obtains a sample of the output of the amplifier 14 when gated by a SYNC GATE signal which is timed to occur during the horizontal sync interval of a white negative video modulation signal. Thus the value stored by the storage capacitor represents the maximum forward current required by the laser diode 12. This sampled voltage is input to a comparator circuit, or error amplifier, 18 for comparison with a reference voltage $V_{ref}$. The output of the comparator 18 is an error voltage E which is input to respective dependent current sinks 20, 22 to produce respective currents $I_1$, $I_2$, the values of which are determined by respective constants K1, K2 where K1>K2. A current mirror 24 reflects $I_2$ to a third current source 26 where it is modulated by the input video modulation signal M to produce a third current $I_3$. $I_3$ is the modulation component of the drive current for the laser diode 10.

Figure 3:
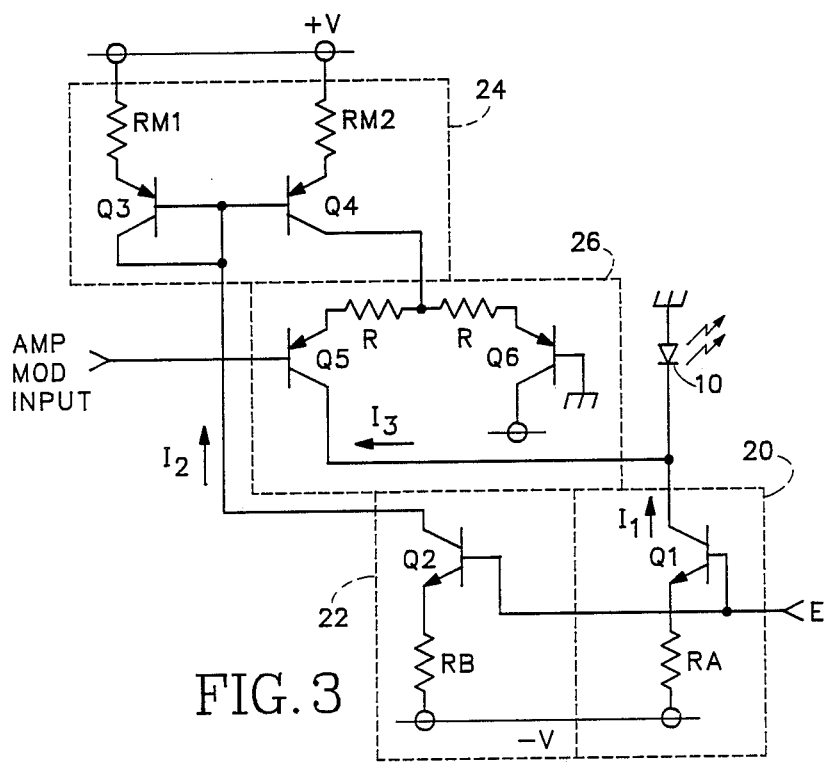
FIG. 3 is a schematic diagram of a portion of the tracking modulation limiter of FIG. 2.

As shown in greater detail in FIG. 3 the first current source 20 has a transistor Q1 with the error voltage E as a base input. The collector of Q1 provides the maximum forward current $I_1$ to the laser diode 10. The emitter is coupled to an emitter bias voltage −V through an emitter resistor RA. Likewise the second current source 22 has a transistor Q2 with the error voltage E as a base input. The collector of Q2 provides the control current $I_2$ to the current mirror 24. The emitter is coupled to the emitter bias voltage −V through an emitter resistor RB having a value greater than RA. $I_2$ is input to the base of a diode connected transistor Q3 having the emitter coupled through a first mirror resistor RM1 to a second emitter bias voltage +V, and also is input to the base of a second mirror transistor Q4 having the emitter coupled through a second mirror resistor RM2 to the second emitter bias voltage +V where RM1=RM2. The collector of the second mirror transistor Q4 provides the reflected $I_2$ to the third current source 26.

The input video modulation signal is input to the base of a modulator transistor Q5, the collector of which provides the modulated current $I_3$ to the laser diode 10 and is connected to the collector of Q1. The emitter of Q5 is coupled to the emitter of a reference transistor Q6 via an emitter resistor, the base of Q6 being returned to a reference potential such as ground and the collector being returned to an appropriate bias potential. The reflected control current $I_2$ is coupled to the third current source transistors Q5, Q6 via the emitter resistor R so that it is divided between the transistors according to the input video modulation signal. When the input video modulation signal is at maximum, such as at the horizontal sync interval, Q5 conducts at a minimum level so that $I_3$ is minimum and the laser diode conducts essentially at its maximum forward current. When the input video modulation signal is at minimum, such as at WHITE, Q5 conducts at a maximum level so that $I_3$ is maximum and the laser diode conducts essentially at its threshold current.

In operation as the laser diode transform characteristic changes due to temperature and age, to attain the constant average power out of the laser diode 10 the value of $I_1$ needs to change. For example as temperature increases, the power output decreases for the same drive current, producing an error voltage E which causes $I_1$, as well as $I_2$, to increase. The increase of $I_2$ is reflected in an increase in $I_3$ when modulated by WHITE. However due to the increase in $I_1$ and due to the fact that the ratio of K2/K1 is less than one, the increase in $I_3$ is less than than in $I_1$ so that the current through the laser diode 10 does not drop below the threshold current.

Since the laser diode 10 and the photodiode 12 generally are in the form of a hybrid module, the mechanical positioning of the two devices has a large effect on the photo generated current from the photodiode. The hybrid module is provided with a data sheet which includes an actual plot of the laser diode's optical output power vs. forward current and a simultaneous plot of photodiode's photo current vs. laser diode output. From the laser threshold current and proper operating current shown on the data sheet the values for RA and RB are selected. Where the hybrid modules are sufficiently uniform fixed values of RA and RB may be chosen.

Vref is selected at a convenient level between ground and $-V$. The feedback resistor around amplifier 14 is chosen such that the photodiode's photo current through the feedback resistor results in a voltage at the output that matches Vref.

Thus the present invention provides a tracking modulation limiter for lasers by tracking a maximum forward current for the laser and correspondingly adjusting a control current which is modulated by an input video modulation signal such that the increase of a modulation current combined with the maximum forward current assures that the laser current does not drop below threshold.

What is claimed is:

1. A tracking modulation limiter for a laser diode having two distinct modes of operation comprising:
   means for tracking a maximum forward current for the laser; and
   means for multiplying the maximum forward current by a factor less than one to produce a control current to limit depth of modulation for the laser so that a drive current for the laser stays above a threshold value at a maximum negative modulation.

2. A limiter as recited in claim 1 wherein the tracking means comprises:
   means for sampling the output of the laser at a maximum positive modulation; and
   means for generating from the sampled output of the laser an error voltage representative of the maximum forward current.

3. A limiter as recited in claim 2 wherein the sampling means comprises:
   means for converting the output of the laser into an electrical signal; and
   means for sampling and holding a portion of the electrical signal in response to a gate command which occurs at the maximum positive modulation.

4. A limiter as recited in claim 2 wherein the tracking means further comprises means for converting the error voltage into the maximum forward current.

5. A limiter as recited in claim 2 wherein the multiplying means comprises means for converting the error voltage into the control current having a value which is less than that of the maximum forward current.

6. A limiter as recited in claim 1 further comprising:
   means for modulating the control signal with an input modulation signal; and
   means for combining the modulated control signal with the maximum forward current to drive the laser.

7. A limiter as recited in claim 6 wherein the input modulation signal comprises a white negative video modulation signal having a horizontal sync interval as the maximum positive modulation with the gate command occurring during the horizontal sync interval.

* * * * *